United States Patent [19]
Kaneda

[11] Patent Number: 5,299,221
[45] Date of Patent: Mar. 29, 1994

[54] LASER LIGHT GENERATING APPARATUS

[75] Inventor: Yushi Kaneda, Kanagawa, Japan

[73] Assignee: Sony Corporation, Tokyo, Japan

[21] Appl. No.: 104,395

[22] Filed: Aug. 9, 1993

Related U.S. Application Data

[63] Continuation of Ser. No. 923,954, Sep. 4, 1992, abandoned.

[30] Foreign Application Priority Data

Jan. 9, 1991 [JP] Japan .................. 3-012842

[51] Int. Cl.$^5$ ........................................... H01S 3/094
[52] U.S. Cl. ................................. 372/75; 372/71;
372/19; 372/29; 372/32
[58] Field of Search .............. 372/75, 72, 71, 69,
372/19, 18, 20, 29, 92, 97, 32

[56] References Cited

U.S. PATENT DOCUMENTS

| | | | |
|---|---|---|---|
| 3,787,888 | 1/1974 | Haskai ................. | 346/108 |
| 4,493,085 | 1/1985 | Valley ................. | 372/19 |
| 4,910,740 | 3/1990 | Oka .................... | 372/22 |
| 4,933,947 | 6/1990 | Anthon et al. ........ | 372/34 |
| 5,123,026 | 6/1992 | Fan et al. ............ | 372/75 |
| 5,185,758 | 2/1993 | Fan et al. ............ | 372/72 |
| 5,197,073 | 3/1993 | Oka .................... | 372/21 |
| 5,202,893 | 4/1993 | Kubota et al. ........ | 372/71 |

FOREIGN PATENT DOCUMENTS 2182168A  5/1987  United Kingdom ........... H01S 3/00

OTHER PUBLICATIONS

2412 Optics Letters, vol. 13, No. 4, Apr. 1988, New York, pp. 306-308, J. Berger, et al. Fiber-Bundle Coupled, Diode End-Pumped Nd:YAG Laser.

8106 IEEE Journal of Quantum Electronics, vol. QE-22, #6, Jun. 1986, New York, pp. 749-753, J. R. Heidel et al., 'Use of a Phase Corrector Plate to Generate a Single-Lobed Phased Array Far Field Pattern Array Far Field Pattern' paragraphs I, II, V, FIGS. 1-5).

Primary Examiner—Georgia Y. Epps
Attorney, Agent, or Firm—Limbach & Limbach

[57] ABSTRACT

A laser light generating apparatus of the invention comprises an exciting light source (1) for generating a plurality of exciting laser beams, a laser medium (7) for generating at least two laser beams with radiation of the plurality of exciting laser beams at different positions thereof, reflecting means (8) for reflecting at least a part of the laser beams generated from the laser medium (7) and constructing a laser resonator (5) with thermal lenses (7a) through (7d) formed within the laser medium (7), and phase-compensating means (9) for compensating a phase of a laser beam from the laser resonator (5). Therefore, the laser generating apparatus becomes able to generate a laser beam whose energy is much concentrated within a small divergent angle. Furthermore, it becomes possible to control the laser beam in tracking by changing a phase-compensating amount of the phase-compensating means.

4 Claims, 5 Drawing Sheets

… …

LASER LIGHT GENERATING APPARATUS

This is a continuation of co-pending application Ser. No. 07/923,954 filed on Sep. 4, 1992, now abandoned.

TECHNICAL FIELD

The present invention relates to a laser light generating apparatus capable of generating a laser beam whose energy is much concentrated in a range of a small divergent angle.

BACKGROUND ART

The applicant of the present invention has previously proposed a solid state laser of a phase synchronizing type that is considerably compact in size, as described in Japanese Patent Application No. 2-198441. According to this proposal, a plurality of pumping laser beams generated from a plurality of laser diodes are radiated on a laser medium at its different positions to produce thermal lenses in this laser medium. The thermal lenses, the laser medium and mirrors disposed before and after the laser medium constitute a laser resonator, whereby a plurality of laser beams are generated from the laser medium.

Study of experimental results of the previously-proposed laser light generating apparatus, however, revealed that adjoining oscillation regions of the laser medium tend to oscillate with opposite phases. Consequently, when a pumping laser beam radiates the two oscillation regions of the laser medium to generate two laser beams, then the far field pattern of the two laser beams presents a double-hump response as shown in FIG. 6 so that the conventional laser light generating apparatus cannot generate a laser beam whose strong energy is concentrated within a small range, In view of the aforesaid aspects, the present invention is to provide a laser light generating apparatus which can generate a laser beam whose powerful energy is concentrated within a small divergent angle.

DISCLOSURE OF THE INVENTION

As a first aspect of the present invention, a laser light generating apparatus comprises an exciting light source for generating a plurality of exciting laser beams, a laser medium for generating at least two laser beams with radiation of the plurality of exciting laser beams at different positions thereof, reflecting means for reflecting at least a part of the laser beams generated from the laser medium and constructing a laser resonator with thermal lenses formed within the laser medium, and phase-compensating means for compensating a phase of a laser beam from the laser resonator.

As a second aspect of the present invention, the laser generating apparatus of the first aspect of the present invention further comprises detecting means for detecting a part of the laser beam emitted from the laser resonator, wherein an amount with which a phase of the laser beam from the laser resonator is compensated for by the phase-compensating means is controlled on the basis a detected output from the detecting means.

According to a third aspect of the present invention, the phase-compensating means of the second aspect of the present invention is formed of a Pockels cell.

Furthermore, in accordance with a fourth aspect of the present invention, the phase-compensating means of the first aspect of the present invention phase-compensates at least two laser beams emitted from the laser resonator such that a phase difference therebetween becomes substantially ½-wavelength.

BEST MODE FOR CARRYING OUT THE INVENTION

Figure 1:
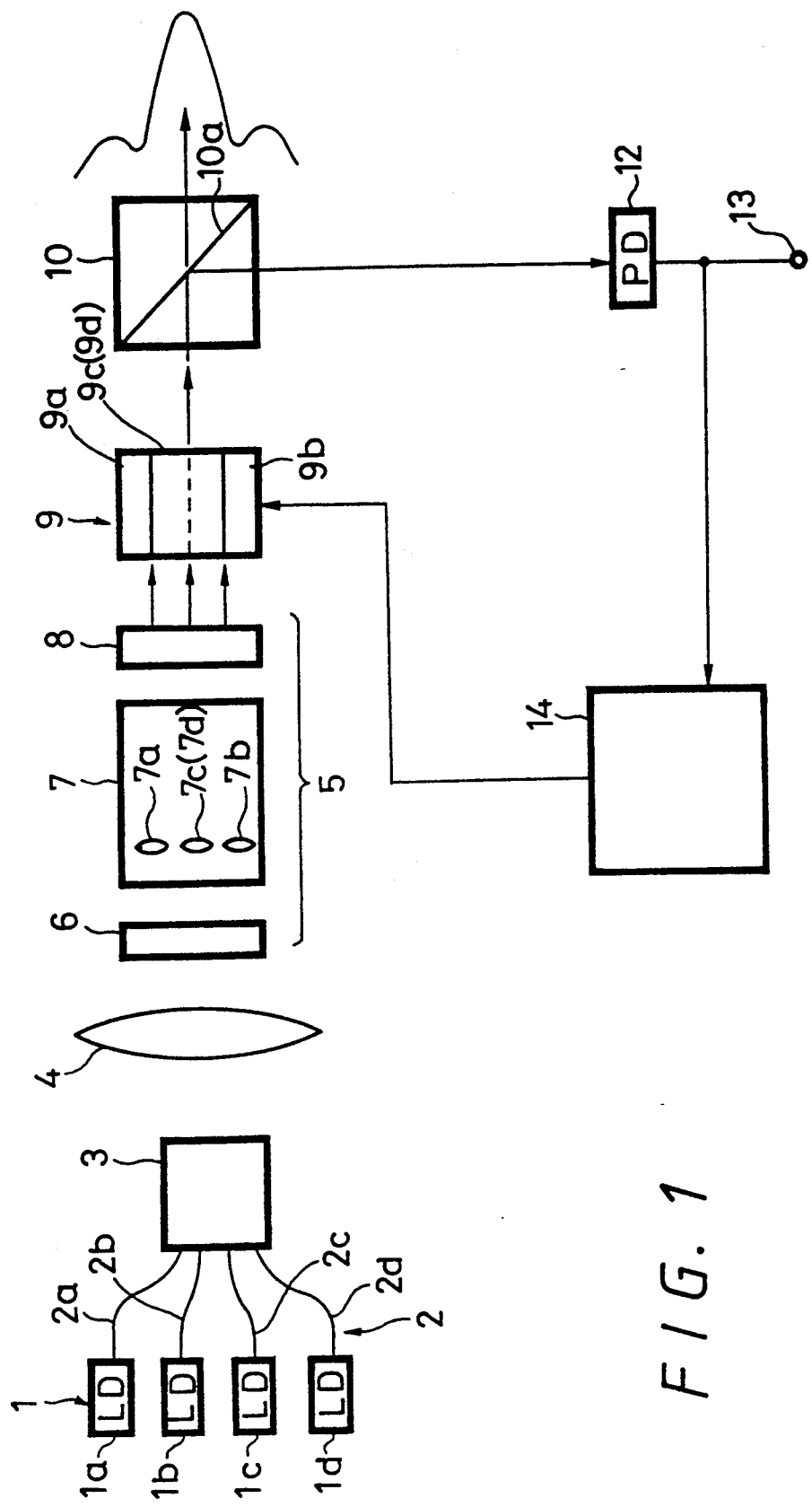
FIG. 1 is a diagram of a structure of a laser light generating apparatus according to an embodiment of the present invention.
Figure 2:
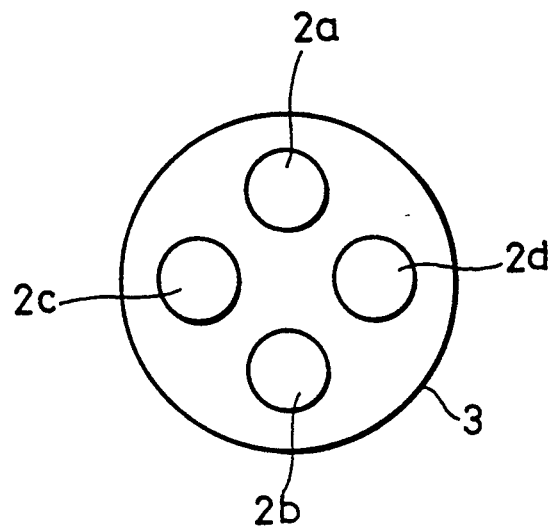
FIG. 2 is a front view of a coupler shown in FIG. 1.

FIG. 1 is a diagram showing a structure of a laser generating apparatus according to an embodiment of the present invention. A pumping light source 1 is composed of laser diodes 1a through 1d. Pumping laser beams generated from the laser diodes 1a through 1d are transmitted via optical fibers 2a through 2d to a coupler 3. As shown in FIG. 2, the coupler 3 disposes the optical fibers 2a through 2d at four vertexes of a square in this embodiment. Four laser beams from the coupler 3 are converged by a lens 4 and radiated on a laser medium 7 at its different positions by way of a mirror 6, whereby the laser medium 7 (Nd:YAG) is heated at its radiated portions with the radiation of four corresponding laser beams to form four thermal lenses 7a through 7d in the inside thereof. As a consequence, substantially four resonating sections are formed within a resonator 5 in correspondence with mirrors 6, 8 disposed before and after the laser medium 7 and the four thermal lenses 7a through 7d.

A fundamental mode oscillation laser beam is generated from the laser medium 7 at its region radiated with a single pumping laser beam. This laser beam is reflected on the mirror 8, traveled through the thermal lens 7a and then radiated on the mirror 6. Then, the laser beam reflected on the mirror 6 is radiated on the mirror 8 through the thermal lens 7a one more time. In this way, the laser beam travels back and forth between the mirrors 6 and 8, thereby generating a laser beam having strong energy. At that time, the thermal lens 7a and the mirror 8 constitute a substantially concave mirror.

Similar operation is carried out in other three regions of the laser medium 7, resulting in four powerful laser beams.

The mirror 6 passes perfectly all of the pumping laser beams but reflects perfectly all of the laser beams generated from the laser medium 7. Further, the mirror 8 passes several percent of through ten and several percent of the laser beams generated from the laser medium 7 and reflects remaining laser beams.

Figure 3:
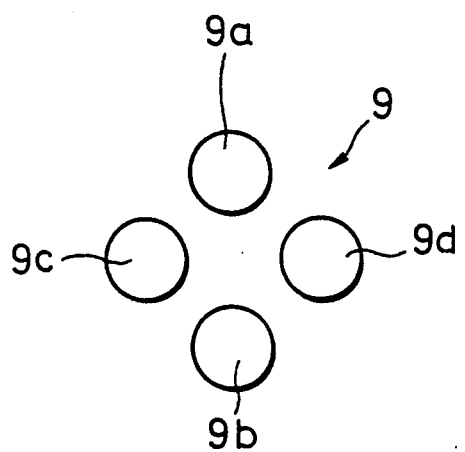
FIG. 3 is a diagram used to explain a relation with which phase-compensators in FIG. 1 are disposed.
Figure 6:
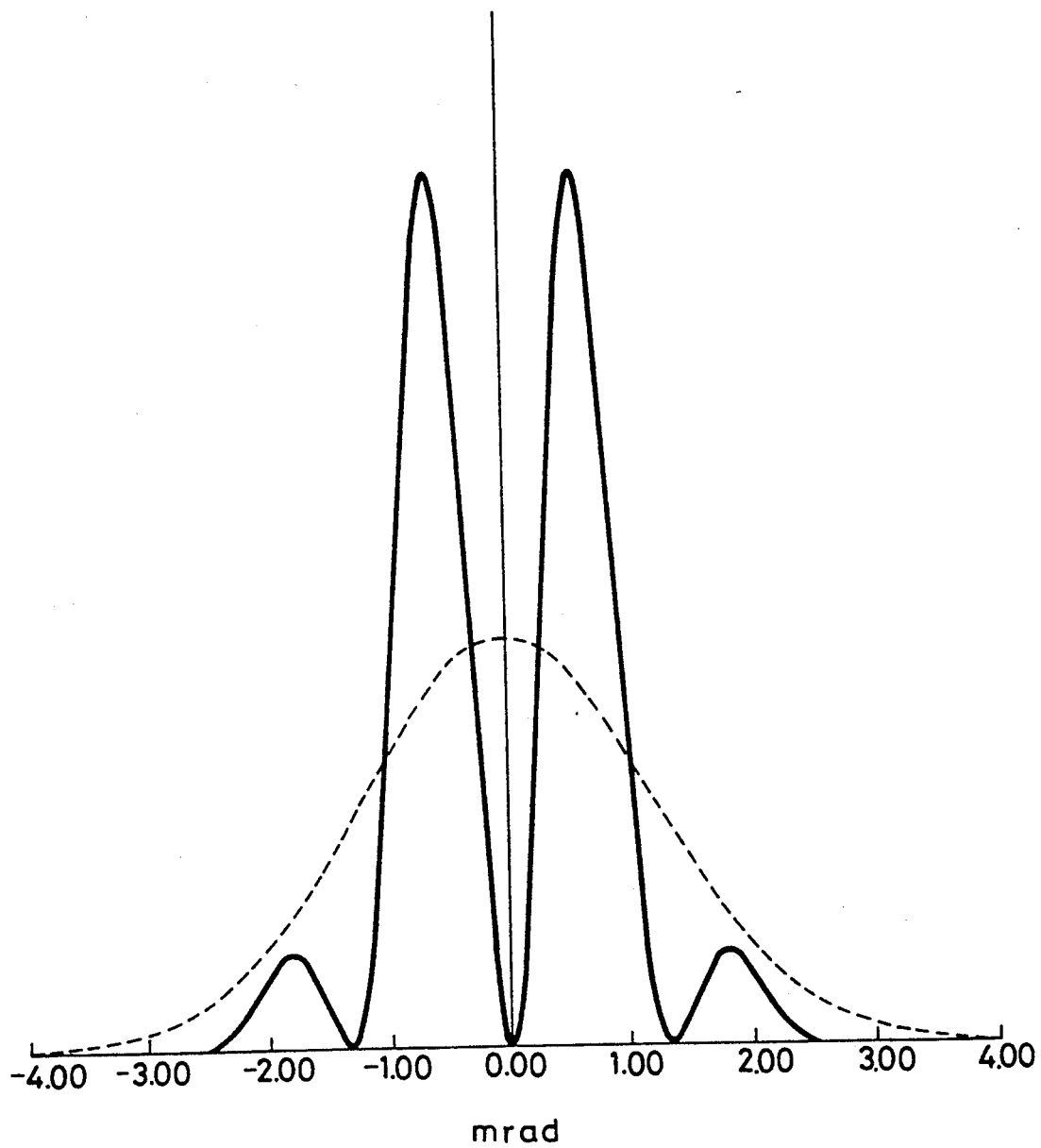
FIG. 6 is a diagram used to explain a far-field pattern of an example of a prior-art laser light generating apparatus.

The four laser beams from the mirror 8 become incident on four phase-compensators 9a through 9d that are disposed in response to the respective laser beams. FIG. 3 shows a relation with which the four phase-compensators 9a through 9d are disposed. It is to be understood from this figure that the four the four optical fibers shown in FIG. 2. As described above, the far-field patterns of the two laser beams from the mirror 8 present a double-hump response. That is, study of two laser beams incident on the phase-compensators 9a and 9d disposed in the vertical direction, for example, reveals that the far-field pattern thereof in the plane including y-axis (within the vertical plane) presents a double-hump response as shown in FIG. 6. Further, study of two laser beams incident on the phase-compensators 9c and 9d disposed in the horizontal direction reveals that the far-field pattern in the plane including x-axis (within the horizontal plane) also presents a double-hump response as shown in FIG. 6.

Figure 4:
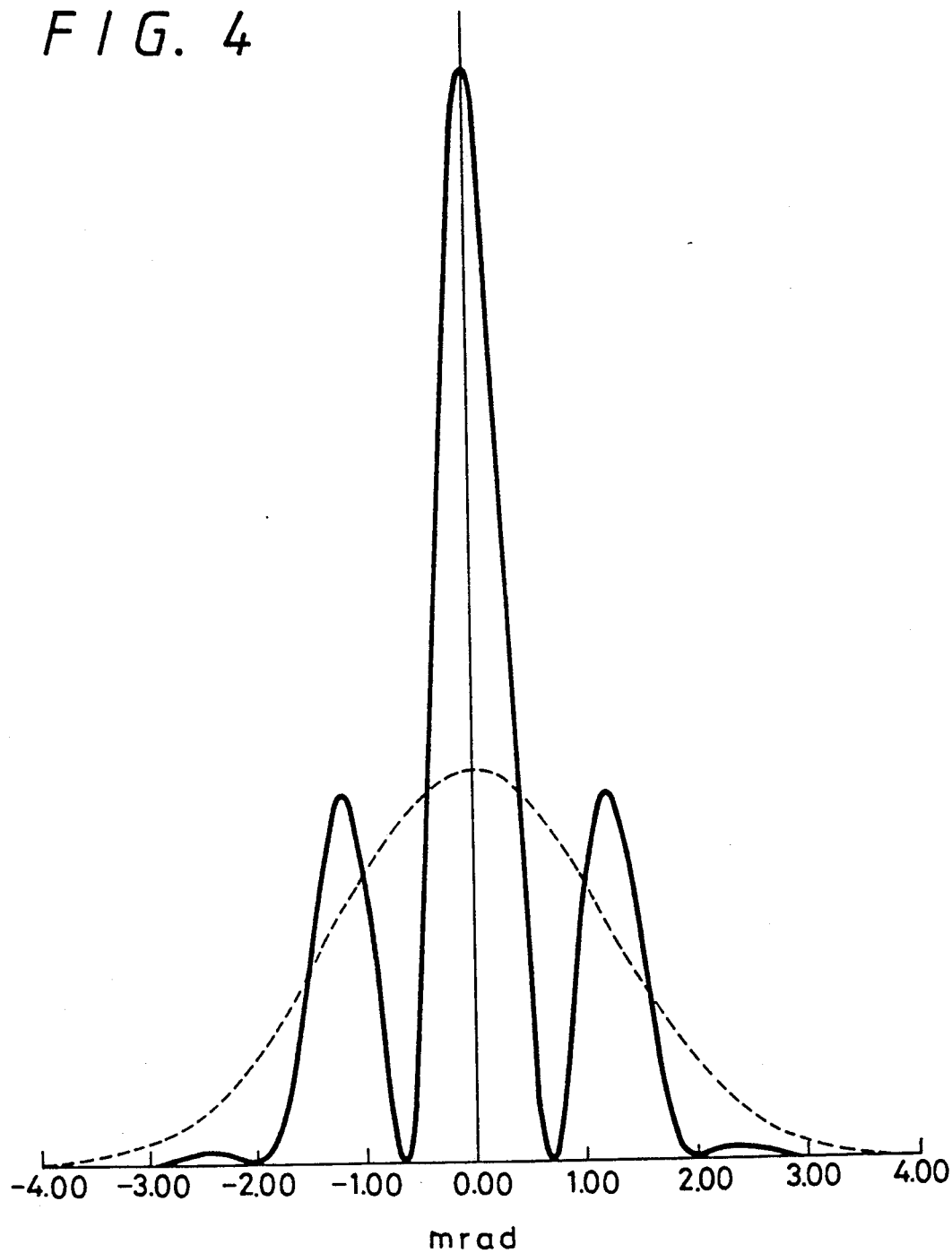
FIG. 4 is a diagram used to explain a far-field pattern in the embodiment of FIG. 1.

Therefore, according to the present invention, the phase-compensating amounts of the two phase-compensators disposed within the horizontal and vertical planes are different by just a ½-wavelength. That is, the phase-compensator 9a has an optical path difference of ½-wavelength relative to the phase-compensator 9d. Similarly, the phase-compensator 9c has an optical path difference of ½- wavelength relative to the phase-compensator 9d. As described above, the laser beams incident on the phase-compensators 9a, 9b from the mirror 8 are opposite in phase so that the phase of the laser beams from the phase-compensator 9a becomes the same as that of the laser beam from the phase-compensator 9b. Similarly, the phase of the laser beam from the phase-compensator 9c becomes the same as that of the laser beam from the phase-compensator 9d. Consequently, laser beams from the phase-compensator 9 interfere with each other both in the vertical and horizontal planes, causing the far-field pattern in the horizontal plane and the far-field pattern in the vertical plane to present a single peak response as shown in FIG. 4. In this embodiment, a distance d between two regions on the laser medium 7 along the vertical direction (or horizontal direction) is selected to be 800 μm and a diameter w0 of beam spot formed on the laser medium 7 is selected to be 200 μm. A characteristic shown by a dashed curve in FIG. 4 indicates a single laser whose emission region has the same light intensity included in a unit divergent angle or array that emits a laser beam in an incoherent fashion. Comparing a solid curve characteristic of the present invention with the dashed curve characteristic, it becomes clear that the laser beam of the present invention has more powerful energy concentrated within a smaller range.

Insofar as the far-field pattern presents a single peak response only in either the horizontal or vertical plane, the laser diode 1 and the phase-compensator 9 may be disposed only in either the vertical or horizontal plane.

If the phase-compensator 9 is formed of a variable phase-compensator (electrooptic device) that utilizes Pockels effect or the like and the phase-compensating amount thereof is adjusted arbitrarily by the application of a voltage, then a direction (angle) from which the laser beam is emitted can be changed. More specifically, the laser beam from the phase-compensator 9 is input through a beam splitter 10 to an optical modulator, not shown, in which it is optically modulated and then transmitted to a communication destination. A part of laser beam reflected on a reflecting surface 10a of the beam splitter 10 is photo-sensed by a photo-diode 12. A controller 14 operates to control the phase-compensating amount of the phase-compensator 9 by the application of voltage to the phase-compensator in response to an output that is developed at an output terminal 13 from the photo-diode 12.

Figure 5:
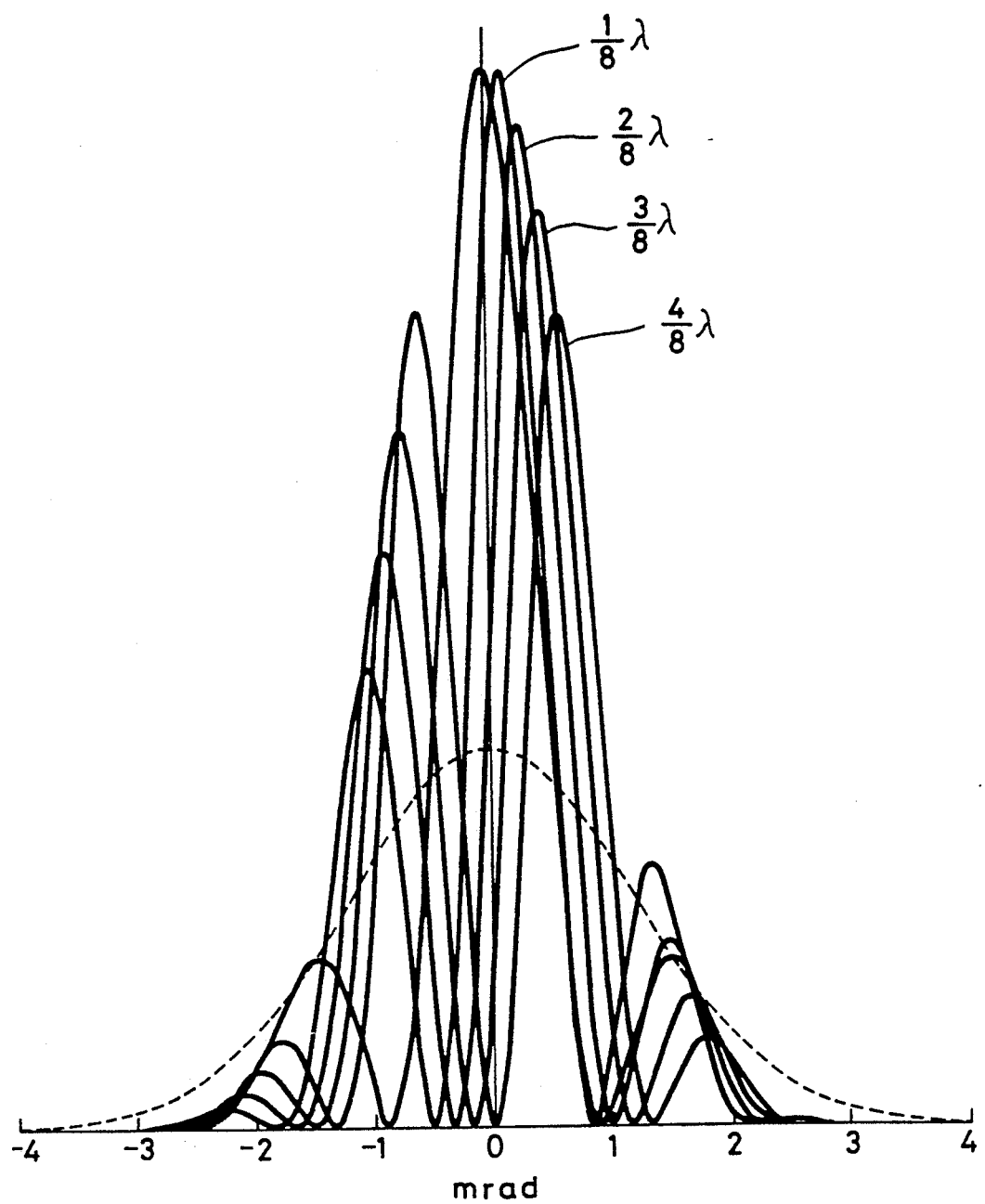
FIG. 5 is a diagram used to explain a far-field pattern when a tracking control is effected according to the embodiment of FIG. 1.

FIG. 5 shows measured results of characteristics of two laser beams output from the two phase-compensators 9a, 9b (9c and 9d) under the condition such that the phase difference therebetween is set to 0 degree, ⅛-wavelength, 2/8-wavelength, ⅜-wavelength or 4/8-wavelength, respectively. By changing the phase difference between the two laser beams as described above, the direction in which the two laser beams are output as a single laser beam can be changed by a predetermined angle. While the increase of the phase difference between the two laser beams is responsible for decreasing the energy of the laser beam, it is appreciated that the laser light generating apparatus of the invention can generate a laser beam of sufficiently large level as compared with a single laser diode having an emission region whose light intensity is the same as shown by a dashed curve.

In the event that this laser beam is utilized for a communication between relatively distant two points (when utilized for free space optical communication), the direction in which the laser beam is emitted can be changed (i.e., tracking control) by controlling the phase instead of controlling the direction of the emitted laser beam by mechanical means such as a mirror or the like. A range in which the tracking control can be effected by this apparatus is a small range below 1 mrad and an angle of 1 mrad corresponds to 1 meter in the place before 1 kilometer. Therefore, in actual practice, this tracking range is sufficiently useful for the tracking adjustment in the distant place.

If the tracking control is not needed, then the phase-compensating amount of the phase-compensator 9 may of course be fixed. In this case, the phase-compensator may be formed of some suitable materials such as KTP (KTiOPO4) (uniaxial crystal having a single optical axis), a ½-wavelength thin film or the like.

As described above, according to the laser light generating apparatus of the present invention, since the phases of a plurality of laser beams from the resonator are compensated to the predetermined ones by the phase-compensator, the laser generating apparatus can generate a laser beam whose energy is much concentrated within the small divergent angle. Furthermore, the laser beam can be controlled in tracking by changing the phase-compensating amount of the phase-compensator.

What is claimed is:

1. A laser light generating apparatus comprising:
   an exciting light source for generating a plurality of exciting laser beams;
   a laser medium for generating at least two laser beams with radiation of said plurality of exciting laser beams at different positions thereof;
   reflecting means for reflecting at least a part of said laser beams generated from said laser medium and constructing a laser resonator with thermal lenses formed within said laser medium; and
   phase-compensating means for compensating a phase of a laser beam from said laser resonator.

2. The laser light generating apparatus according to claim 1, further comprising detecting means for detecting a part of said laser beam emitted from said laser resonator, wherein an amount with which a phase of said laser beam from said laser resonator is compensated for by said phase-compensating means is controlled on the basis a detected output from said detecting means.

3. The laser light generating apparatus according to claim 2, wherein said phase-compensating means is formed of a Pockels cell.

4. The laser light generating apparatus according to claim 1, wherein said phase-compensating means phase-compensates at least two laser beams emitted from said laser resonator such that a phase difference therebetween becomes substantially ½-wavelength.

* * * * *